(12) United States Patent
Huang et al.

(10) Patent No.: US 11,454,456 B2
(45) Date of Patent: Sep. 27, 2022

(54) HEAT PIPE WITH CAPILLARY STRUCTURE

(71) Applicant: DELTA ELECTRONICS, INC., Taoyuan (TW)

(72) Inventors: Shih-Lin Huang, Taoyuan (TW); Chiu-Kung Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 436 days.

(21) Appl. No.: 16/503,251

(22) Filed: Jul. 3, 2019

(65) Prior Publication Data

US 2019/0323781 A1 Oct. 24, 2019

Related U.S. Application Data

(63) Continuation-in-part of application No. 14/793,132, filed on Jul. 7, 2015, now abandoned.

(30) Foreign Application Priority Data

Nov. 28, 2014 (CN) .......................... 201410706245.6

(51) Int. Cl.
| | | |
|---|---|---|
| F28D 15/00 | (2006.01) | |
| F28D 15/04 | (2006.01) | |
| F28F 13/00 | (2006.01) | |
| F28D 15/02 | (2006.01) | |

(52) U.S. Cl.
CPC ....... *F28D 15/046* (2013.01); *F28D 15/0233* (2013.01); *F28F 13/00* (2013.01); *F28F 2270/00* (2013.01)

(58) Field of Classification Search
CPC .... F28D 15/0233; F28D 15/04; F28D 15/046; F28F 13/00; F28F 2270/00
See application file for complete search history.

(56) References Cited

U.S. PATENT DOCUMENTS

| | | |
|---|---|---|
| 3,498,369 A | 3/1970 | Levedahl |
| 3,620,298 A | 11/1971 | Somerville et al. |
| 3,734,173 A | 5/1973 | Moritz |
| 3,777,502 A | 12/1973 | Michie et al. |

(Continued)

FOREIGN PATENT DOCUMENTS

| | | |
|---|---|---|
| CN | 101545734 A | 9/2009 |
| CN | 101545734 A | 9/2009 |
| CN | 201787845 U | 4/2011 |

*Primary Examiner* — Travis Ruby
(74) *Attorney, Agent, or Firm* — Muncy, Geissler, Olds & Lowe, P.C.

(57) ABSTRACT

A heat pipe comprises a first pipe and at least a second pipe. The first pipe includes an evaporator, a heat insulator and a condenser communicating with each other to define a hollow chamber. The second pipe disposed in the hollow chamber includes an accommodating space and a first capillary structure disposed in one end of the accommodating space closer to the evaporator. Two opposite sides of an outer pipe wall of the second pipe directly abut an inner pipe wall of the first pipe. The first pipe further includes a second capillary structure which is disposed in the hollow chamber closer to the evaporator and extended to an outside of the second pipe and occupies at least ⅔ volume of the evaporator. A first part of the first capillary structure and the second capillary structure are connected to each other by winding so as to enhance transportation therebetween.

11 Claims, 7 Drawing Sheets

(56) References Cited

U.S. PATENT DOCUMENTS

| | | |
|---|---|---|
| 3,844,342 A | 10/1974 | Eninger et al. |
| 3,892,273 A | 7/1975 | Nelson |
| 4,003,427 A | 1/1977 | Leinoff et al. |
| 4,018,269 A | 4/1977 | Honda et al. |
| 4,019,571 A | 4/1977 | Kosson et al. |
| 4,020,898 A | 5/1977 | Grover |
| 4,058,159 A | 11/1977 | Iriarte |
| 4,109,709 A | 8/1978 | Honda et al. |
| 4,116,266 A | 9/1978 | Sawata et al. |
| 4,248,295 A | 2/1981 | Ernst et al. |
| 4,414,961 A | 11/1983 | Luebke |
| 4,441,548 A | 4/1984 | Franklin et al. |
| 4,463,798 A | 8/1984 | Pogson et al. |
| 4,474,170 A | 10/1984 | McConnell et al. |
| 4,515,209 A | 5/1985 | Maidanik et al. |
| 4,640,347 A | 2/1987 | Grover et al. |
| 4,815,528 A | 3/1989 | Shaubach et al. |
| 4,815,529 A | 3/1989 | Miyazaki et al. |
| 4,909,316 A | 3/1990 | Kamei et al. |
| 5,036,908 A | 8/1991 | Petroff et al. |
| 5,046,553 A | 9/1991 | Lindner |
| 5,335,720 A | 8/1994 | Ogushi et al. |
| 6,148,906 A | 11/2000 | Li et al. |
| 6,508,302 B2 | 1/2003 | Ishida et al. |
| 6,725,910 B2 | 4/2004 | Ishida et al. |
| 7,445,039 B2 | 11/2008 | Hou et al. |
| 7,647,961 B2 | 1/2010 | Thayer et al. |
| 7,802,362 B2 | 9/2010 | Hou et al. |
| 7,866,373 B2 | 1/2011 | Hou et al. |
| 8,622,117 B2 | 1/2014 | Wu et al. |
| 8,919,427 B2 | 12/2014 | Wang et al. |
| 2001/0047859 A1 | 12/2001 | Ishida et al. |
| 2004/0188067 A1 | 9/2004 | Chau et al. |
| 2005/0098302 A1 | 5/2005 | Hsieh |
| 2006/0086482 A1 | 4/2006 | Thayer et al. |
| 2007/0039718 A1 | 2/2007 | Chen |
| 2007/0089864 A1 | 4/2007 | Chang et al. |
| 2007/0107877 A1 | 5/2007 | Hou et al. |
| 2007/0107878 A1 | 5/2007 | Hou et al. |
| 2007/0114008 A1 | 5/2007 | Hou et al. |
| 2007/0295485 A1 | 12/2007 | Liu et al. |
| 2009/0020268 A1 | 1/2009 | Chang et al. |
| 2009/0020269 A1 | 1/2009 | Chang et al. |
| 2009/0084526 A1 | 4/2009 | Chang et al. |
| 2009/0260793 A1 | 10/2009 | Wang et al. |
| 2009/0308576 A1 | 12/2009 | Wang et al. |
| 2010/0155031 A1 | 6/2010 | Wu et al. |
| 2010/0155032 A1 | 6/2010 | Wu et al. |
| 2010/0155033 A1 | 6/2010 | Holley et al. |
| 2010/0212870 A1 | 8/2010 | Wu et al. |
| 2010/0319882 A1 | 12/2010 | Lee et al. |
| 2011/0030924 A1 | 2/2011 | Kawabata et al. |
| 2011/0100608 A1 | 5/2011 | Huang et al. |
| 2011/0174464 A1 | 7/2011 | Liu et al. |
| 2011/0174465 A1 | 7/2011 | Liu et al. |
| 2011/0174466 A1 | 7/2011 | Liu et al. |
| 2011/0214841 A1 | 9/2011 | Huang et al. |
| 2011/0277964 A1 | 11/2011 | Dai et al. |
| 2011/0303392 A1 | 12/2011 | Horiuchi et al. |
| 2012/0037344 A1 | 2/2012 | Meyer, IV et al. |
| 2012/0048516 A1 | 3/2012 | He et al. |
| 2012/0048517 A1 | 3/2012 | Huang et al. |
| 2012/0111539 A1 | 5/2012 | Dai et al. |
| 2012/0111542 A1 | 5/2012 | Fridy et al. |
| 2012/0118537 A1 | 5/2012 | Kameoka et al. |
| 2012/0227934 A1 | 9/2012 | Huang |
| 2012/0273169 A1 | 11/2012 | Fu |
| 2012/0305223 A1 | 12/2012 | Yang et al. |
| 2013/0126131 A1 | 5/2013 | Chen |
| 2013/0160977 A1 | 6/2013 | Fan |
| 2013/0174966 A1 | 7/2013 | He et al. |
| 2013/0180688 A1 | 7/2013 | Lin et al. |
| 2013/0233518 A1 | 9/2013 | Liu et al. |
| 2013/0248152 A1 | 9/2013 | Hwang et al. |
| 2014/0060781 A1 | 3/2014 | Jia et al. |
| 2014/0166244 A1 | 6/2014 | Dai et al. |
| 2014/0305616 A1 | 10/2014 | Jang et al. |
| 2015/0198379 A1 | 7/2015 | Pai |
| 2016/0153722 A1 | 6/2016 | Huang et al. |
| 2016/0153723 A1 | 6/2016 | Huang et al. |
| 2016/0201992 A1 | 7/2016 | Huang et al. |

HEAT PIPE WITH CAPILLARY STRUCTURE

CROSS REFERENCE TO RELATED APPLICATIONS

This application is a Continuation In Part (CIP) of an earlier filed, pending, application, having application Ser. No. 14/793,132 and filed on Jul. 7, 2015, the content of which, including drawings, is expressly incorporated by reference herein.

BACKGROUND OF THE INVENTION

Field of Invention

This disclosure relates to a heat pipe and, in particular, to a heat pipe wherein the working fluid is driven by the vapor pressure difference.

Related Art

A conventional heat pipe is mainly composed of a sealed metal pipe, a capillary structure inside the metal pipe and a heat-transfer fluid filled in the metal pipe, and besides, a proper vacuum degree is kept inside the metal pipe to lower down the trigger-temperature-difference of the heat pipe. In the heat pipe, the evaporator of the heat pipe is disposed at the heat source so that the heat generated by the heat source can evaporate the fluid (liquid phase) in the pipe into the vapor (vapor phase). The generated vapor is driven by the vapor pressure difference to flow to the condenser of the heat pipe and then condenses back into the liquid phase after releasing the latent heat, and lastly is driven by the capillarity to go back to the evaporator through the capillary structure. Thereby, the heat pipe can transfer the heat rapidly.

Due to its simple structure, high transfer performance and low thermal resistance, the heat pipe has been applied to the electronic field or other heat-dissipation fields for a long time. However, because the electronic product is continuously enhanced in portability, lightness and thinness, 4K image, 4G transmission and more adding functions, the generated heat thereof is raised increasingly. Therefore, the conventional heat pipe can't meet the requirement of the high heat and high heat flux anymore. Accordingly, the heat pipe needs to be further enhanced in performance, for example, the manufacturing method of the capillary structure needs to be improved or the multiple capillary structures can be used so as to enhance the capillarity of the capillary structure. However, the above improvements mostly take a longer procedure and process time and the heat pipe structure formed thereby is also too complicated. Therefore, the cost and the efficiency of the heat pipe can't be both taken into account.

Furthermore, in the operation of a conventional heat pipe, the vapor and the working fluid have opposite flowing directions and they are also not insulated from each other effectively, so that the working fluid needs to overcome the vapor resistance to go back to the evaporator for the next circulation. Accordingly, the capillary condition of the heat pipe needs to be strictly satisfied, that is, the interior capillarity needs to be stronger than the resultant force of the vapor pressure, the backflow resistance of the fluid and the gravity, and then the heat pipe can have the normal circulation.

Therefore, it is an important subject to provide a heat pipe whereby the heat transfer capability can be enhanced under a simple structure design and the requirement of the high heat and high heat flux of the electronic product can be satisfied.

SUMMARY OF THE INVENTION

In view of the foregoing subject, an objective of the disclosure is to provide a heat pipe whereby the heat transfer capability can be enhanced under a simple structure design and the requirement of the high heat and high heat flux of the electronic product can be satisfied.

To achieve the above objective, a heat pipe according to the disclosure comprises a first pipe and at least a second pipe. The first pipe includes an evaporator, a heat insulator and a condenser which communicate with each other to define a hollow chamber. Two ends of the first pipe along an axial direction of the heat pipe are sealed. The second pipe is disposed in the hollow chamber and includes an accommodating space and a first capillary structure disposed in one end of the accommodating space closer to the evaporator. Two opposite sides of an outer pipe wall of the second pipe directly abut an inner pipe wall of the first pipe. The first pipe further includes a second capillary structure which is disposed in the hollow chamber closer to the evaporator and extended to an outside of the second pipe and occupies at least ⅔ volume of the evaporator. A first part of the first capillary structure and the second capillary structure are connected to each other by winding so as to enhance transportation therebetween.

In one embodiment, the second pipe is located in a part of the evaporator, a part of the condenser and the whole heat insulator.

In one embodiment, the second pipe is just located in a part of the condenser and the whole heat insulator.

In one embodiment, a section of the first pipe along a radial direction of the first pipe is a uniform section.

In one embodiment, the first capillary structure is made by metal sintering powder, fiber, mesh or their any combination.

In one embodiment, the second capillary structure is made by metal sintering powder, fiber, mesh or their any combination.

In one embodiment, the second capillary structure contacts a part of the inner pipe wall of the first pipe located at the evaporator and/or a part of the outer pipe wall of the second pipe located at the evaporator.

In one embodiment, the first capillary structure in the second pipe is extended to the outside of the second pipe, and the second capillary structure outside the second pipe entirely or partially covers the first capillary structure extended to the outside of the second pipe.

In one embodiment, the first capillary structure closer to the evaporator is filled in the second pipe.

In one embodiment, the heat pipe further comprises a plurality of second pipes disposed adjacent to each other in the first pipe.

In one embodiment, the hollow chamber of the first pipe is a channel for vapor, the second pipe is a channel for working fluid. The vapor is driven by the vapor pressure difference to move in the first pipe and from the evaporator to the condenser. The working fluid is driven by the vapor pressure difference to flow in the second pipe and from the condenser to the evaporator.

In one embodiment, the inner pipe wall and an outer pipe wall of the first pipe are made of the same material.

In one embodiment, the second capillary structure is rolled up with multiple turns in the evaporator.

In one embodiment, the second capillary structure is rolled up with respect to a traverse direction of the heat pipe in the evaporator.

In one embodiment, the second capillary structure is folded up multiple times in the evaporator.

In one embodiment, the second capillary structure is stuffed with an inside of the evaporator.

To achieve the above objective, a heat pipe according to the disclosure comprises a first pipe and at least a second pipe. The first pipe includes an evaporator, a heat insulator and a condenser which communicate with each other to define a hollow chamber. Two ends of the first pipe along an axial direction of the heat pipe are sealed. The second pipe is disposed in the hollow chamber and includes an accommodating space and a first capillary structure disposed in one end of the accommodating space closer to the evaporator. Two opposite sides of an outer pipe wall of the second pipe directly abut an inner pipe wall of the first pipe. The first capillary structure is extended from the second pipe to form a second capillary structure between the inner pipe wall of the first pipe and the second pipe in the evaporator. The second capillary structure occupies at least ⅔ volume of the evaporator and is folded up multiple times in the evaporator.

In one embodiment, the second capillary structure is stuffed with an inside of the evaporator.

As mentioned above, since the heat pipe of this disclosure includes a first pipe and a second pipe disposed in the first pipe and a first capillary structure is disposed in the portion of the second pipe closer to the evaporator, the vapor can be effectively prevented from flowing back into the second pipe and the working fluid can flow in the second pipe in a single direction. Since this kind of structure is simple for the manufacturing, the quality and yield of the heat pipe can be increased and the cost can be reduced. Furthermore, the heat pipe of this disclosure includes the structure of the inner and outer pipes so that the efficiency of the liquid-vapor circulation in the heat pipe can be enhanced and the heat transfer capability of the heat pipe can be thus enhanced. Therefore, the heat pipe of this disclosure is especially suitable for resisting the temporary heat impact and can effectively meet the requirements of high heat and high heat flux.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE INVENTION

The present disclosure will be apparent from the following detailed description, which proceeds with reference to the accompanying drawings, wherein the same references relate to the same elements.

Figure 1A:
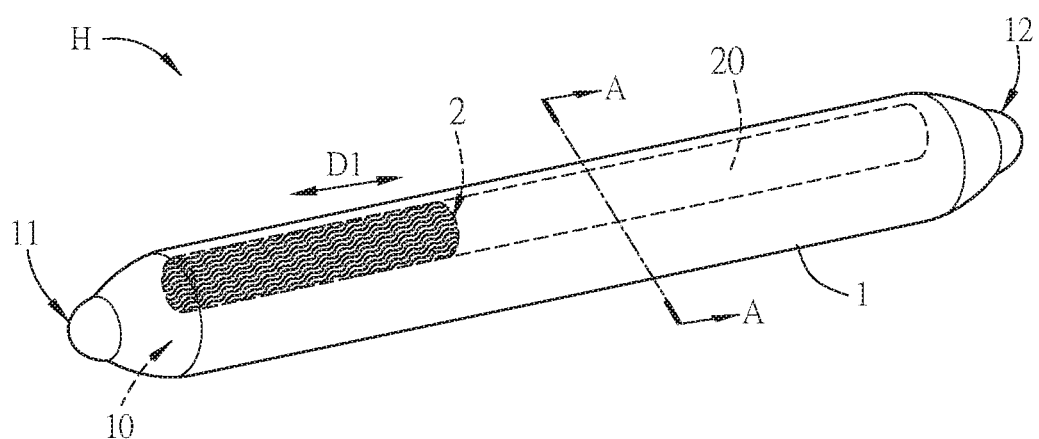
FIG. 1A is a schematic diagram of a part of the appearance of the heat pipe of an embodiment of the disclosure.
Figure 1B:
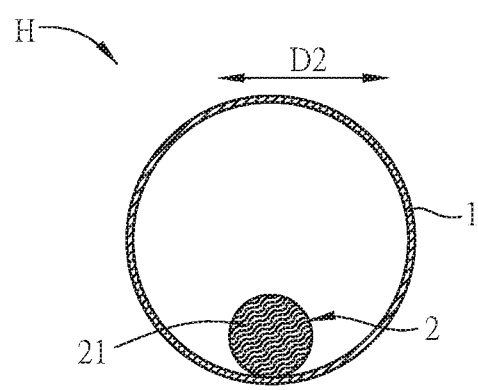
FIG. 1B is a schematic sectional diagram of the heat pipe of FIG. 1A taken along the line A-A.

FIG. 1A is a schematic diagram of a part of the appearance of the heat pipe of an embodiment of the disclosure, and FIG. 1B is a schematic sectional diagram of the heat pipe of FIG. 1A taken along the line A-A. As shown in FIGS. 1A and 1B, in this embodiment, the heat pipe H includes a first pipe 1 and at least a second pipe 2, and a single second pipe 2 is illustrated as an example herein. The first pipe 1 includes a hollow chamber 10 and the second pipe 2 is disposed in the hollow chamber 10.

Herein for example, the first pipe 1 is an elliptic cylindrical thin-type hollow pipe, and the section of the first pipe 1 along the radial direction D2 of the first pipe 1 is a uniform section. The pipe 1 can be made by, for example, copper, silver, aluminum, their alloy or other metal materials with well heat transfer property. In the practical application, in addition to the second pipe 2, a working fluid (not shown) is also disposed in the pipe 1 and can be any fluid helping the evaporation and heat dissipation, such as inorganic compounds, alcohols, ketones, liquid metal, refrigerant, organic compounds or their any mixture. Moreover, the pipe 1 is not limited here in shape or dimensions, which can be a cylindrical pipe or rectangular pipe and can be determined according to the surrounding environment, space, heat transfer requirement or temperature.

Figure 1C:
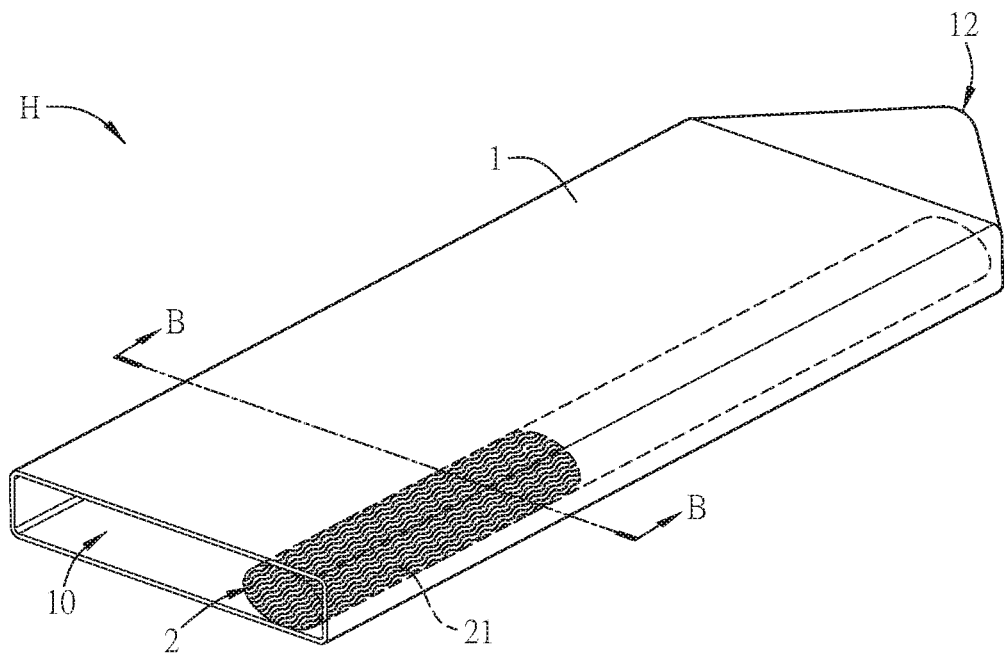
FIG. 1C is a schematic diagram showing the appearance of the heat pipe in FIG. 1A which has been flattened.
Figure 1D:
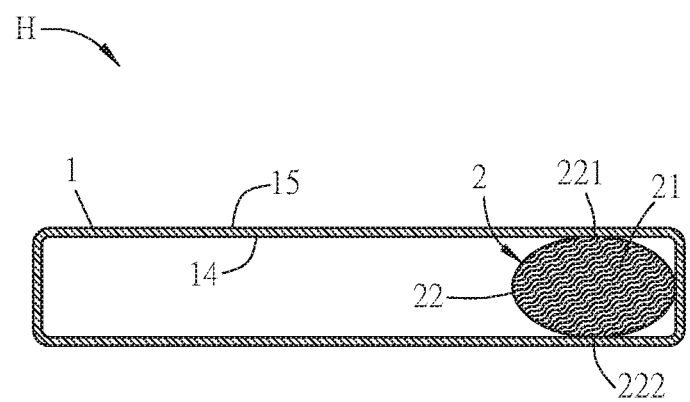
FIG. 1D is a schematic sectional diagram of the heat pipe in FIG. 1C taken along the line B-B.

FIG. 1C is a schematic diagram showing the appearance of the heat pipe in FIG. 1A which has been flattened, and FIG. 1D is a schematic sectional diagram of the heat pipe in FIG. 1C taken along the line B-B. As shown in FIGS. 1A, 1C, 1D, in the formation method of the heat pipe H of this embodiment, the second pipe 2 is disposed in the hollow chamber 10 of the first pipe 1, the working fluid is injected into the heat pipe H and then the vacuum process is implemented to the heat pipe H, and the post-process such as the flattening process is implemented to the first pipe 1 and the second pipe 2 at the same time. Otherwise, the working fluid also can be injected after the first pipe 1 and the second pipe 2 are made vacuum. In other words, the two ends 11, 12 of the first pipe 1 of the heat pipe H of this embodiment along the axial direction D1 are both sealed.

As shown in FIGS. 1A to 1D, the second pipe 2 of the heat pipe H includes an accommodating space 20 and a first capillary structure 21. The first capillary structure 21 is disposed in only a part of the accommodating space 20. Herein for example, the first capillary structure 21 is disposed on the side of the accommodating space 20 closer to the evaporator E, and favorably, the first capillary structure 21 is disposed in the portion of the accommodating space 20 closer to the end 11 of the heat pipe H for about a third of the length of the second pipe 2.

Furthermore, the first capillary structure 21 of this embodiment is formed outside the second pipe 2. Particularly, the first capillary structure 21 is formed outside the second pipe 2 firstly, and can be formed by the high sintering and/or injection molding, but this disclosure is not limited thereto. Besides, before the first capillary structure 21 is disposed in the second pipe 2, the porosity and permeability thereof are properly controlled by the forming method so as to increase the amount of the working fluid flowing back to the evaporator, and therefore the capillarity of the capillary structure can be enhanced and the maximum heat transfer amount (Qmax) of the heat pipe can be effectively increased.

The conventional capillary structure of the heat pipe is made by disposing a core rod in the metal pipe to fix the metal powder and also formed by the high sintering, but the core rod has a high cost and may be damaged during the process of the sintering or removing the core rod, and even the capillary structure may be also damaged, so that the performance of the heat pipe is reduced. However, the first capillary structure 21 of this embodiment is formed on the outside firstly, and the form of the capillary structure can be designed according to the performance requirement and won't be limited by the core rod required for the conventional process. Besides, favorably, the quality of the first capillary structure 21 can be examined outside the second pipe 2 to eliminate the defective products in advance so as to enhance the yield of the heat pipe H.

The formation method of the first capillary structure 21 of this embodiment is not meant to be construed in a limiting sense. In practice, the first capillary structure 21 not only can be made by the metal sintering powder as mentioned above but also can be fiber, mesh or their combination. The formation of the first capillary structure 21 can be determined according to the process or heat-dissipation requirement.

Besides, since the second pipe 2 of the heat pipe H of this embodiment includes the first capillary structure 21, the vapor can be effectively prevented from flowing back into the second pipe 2, and therefore the working fluid can flow in the second pipe 2 in a single direction.

Two opposite sides 221, 222 of an outer pipe wall 22 of the second pipe 2 directly abut an inner pipe wall 14 of the first pipe 1. The inner pipe wall 14 and an outer pipe wall 15 of the first pipe 1 can be made of the same material.

Figure 1E:
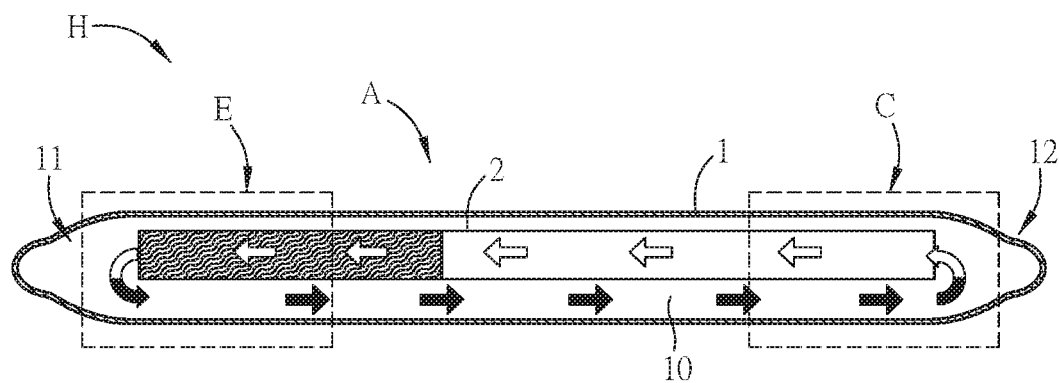
FIG. 1E is a schematic side sectional diagram of the heat pipe of FIG. 1A.
Figure 1F:
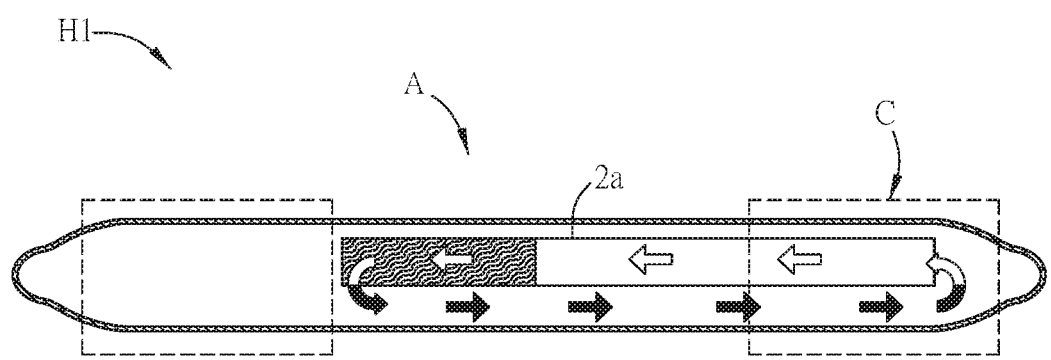
FIG. 1F is a schematic side sectional diagram of the heat pipe of another embodiment of the disclosure.

As shown in FIG. 1E, the structure of the heat pipe H of this embodiment is further illustrated. The first pipe 1 includes an evaporator E, a heat insulator A and a condenser C. The evaporator E, the heat insulator A and the condenser C communicate with each other to define the hollow chamber 10. The evaporator E and the condenser C are respectively closer to the two ends 11, 12 of the first pipe 1, and the heat insulator A is disposed between the evaporator E and the condenser C. To be noted, however, the region of the heat insulator A or condenser C is just for the illustrative purpose and not meant to be construed in a limiting sense. In this embodiment, the second pipe 2 is located in a part of the evaporator E, a part of the condenser C and the whole heat insulator A. However, this disclosure is not limited thereto. In other embodiments (such as FIG. 1F), the second pipe 2a of the heat pipe H1 is just located in a part of the condenser C and the whole heat insulator A.

In the application of the heat pipe H, one end of the heat pipe H disposed at the heat source is the evaporator E of the heat pipe H, and another end of the heat pipe H disposed away from the heat source is the condenser C of the heat pipe H. During the heat dissipation, the working fluid closer to the evaporator E will be evaporated into vapor due to the latent heat generated by the heat source, and the evaporated working fluid will flow towards the condenser C of the first pipe and will condense into the liquid working fluid during the process of moving to the condenser C. At this time, the evaporator E is a high pressure region due to the evaporation while the condenser C is a low pressure region due to the condensation. Accordingly, the vapor pressure formed in the heat pipe H will drive the vapor to move within the first pipe 1 and from the evaporator E, through the heat insulator A and to the condenser C and drive the working fluid to move within the second pipe 2 and from the condenser C, through the heat insulator A and to the evaporator E. That is, the condensed working fluid can be pushed into the second pipe 2 by the vapor pressure and be transferred within the second pipe 2 and to the evaporator E. In other words, the heat generated by the heat source can evaporate the working fluid (liquid phase) within the pipe into the vapor (vapor phase). The generated vapor is driven by the vapor pressure difference to flow to the condenser C of the heat pipe H and then condenses back into the liquid working fluid after releasing the latent heat. Accordingly, the continuous circulation will provide the heat pipe H with the heat-dissipation effect.

Accordingly, the heat pipe H of this embodiment can enhance the heat transfer capability by improving the liquid-vapor circulation. Besides, since the backflow of the working fluid is driven by the vapor pressure, the heat pipe H will undergo less problem of resisting the gravity and can sustain the abrupt increase of the heat source power. Favorably, since the heat pipe H of this embodiment is simple in structure, the quality and yield of the heat pipe can be increased and the cost can be reduced.

Figure 2A:
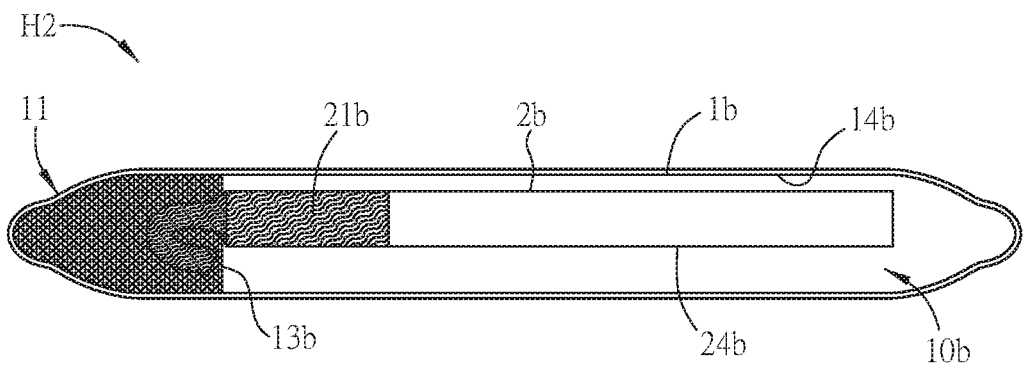
FIGS. 2A to 2C are schematic diagrams of a part of the appearances of the heat pipes of other embodiments of the disclosure.
Figure 2B:
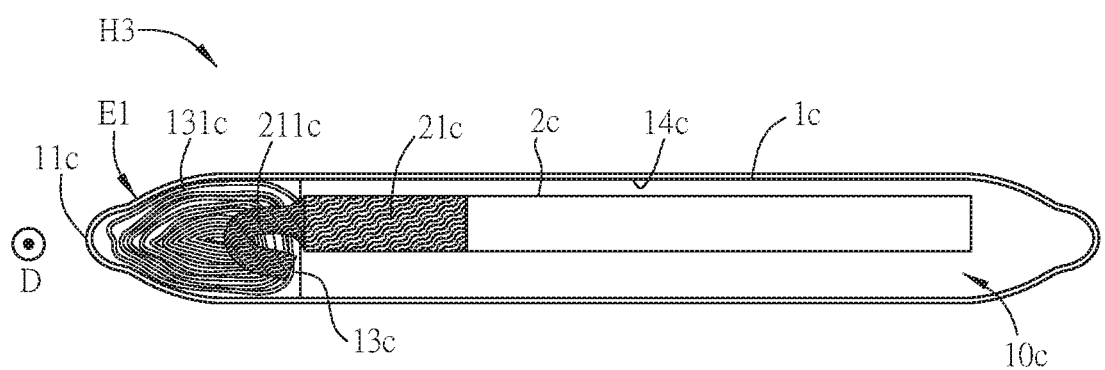

FIGS. 2A and 2B are schematic diagrams of a part of the appearance of the heat pipes of other embodiments of the disclosure. To be noted, the structures of the heat pipes H2, H3 are substantially similar to the heat pipe H1 of the above embodiment, but the heat pipes H2, H3 include second capillary structures 13b, 13c which are disposed in the hollow chamber 10b, 10c closer to the end 11 of the heat pipes H2, H3. In other words, the first capillary structures 21b, 21c and the second capillary structures 13b, 13c are all disposed closer to the end 11 of the heat pipes H2, H3. The second capillary structure 13b of the heat pipe H2 is fiber or favorably mesh, and the second capillary structure 13c of the heat pipe H3 is fine fiber.

As shown in FIG. 2A, in the heat pipe H2 of this embodiment, the second capillary structure 13b contacts a part of the inner pipe wall 14b of the first pipe 1b located at the evaporator E and/or a part of the outer pipe wall 24b of the second pipe 2b located at the evaporator E. The first capillary structure 21b of in the second pipe 2b can be extended to the outside of the second pipe 2b. At least a part of the first capillary structure 21b and the second capillary structure 13b extended to the outside of the second pipe 2b connect to each other or overlap each other, so as to transfer the fluid in the second pipe 2b to the outside of the second pipe 2b and also prevent the vapor from flowing back into the second pipe 2b.

In practice, the relation between the first capillary structure and second capillary structure is not limited to the above-mention case. For example, at least a part of the first capillary structure 21c of the heat pipe H3 and the second capillary structure 13c extended to the outside of the second pipe 2c connect to each other by winding so as to achieve a better effect on the transportation therebetween.

Figure 2C:
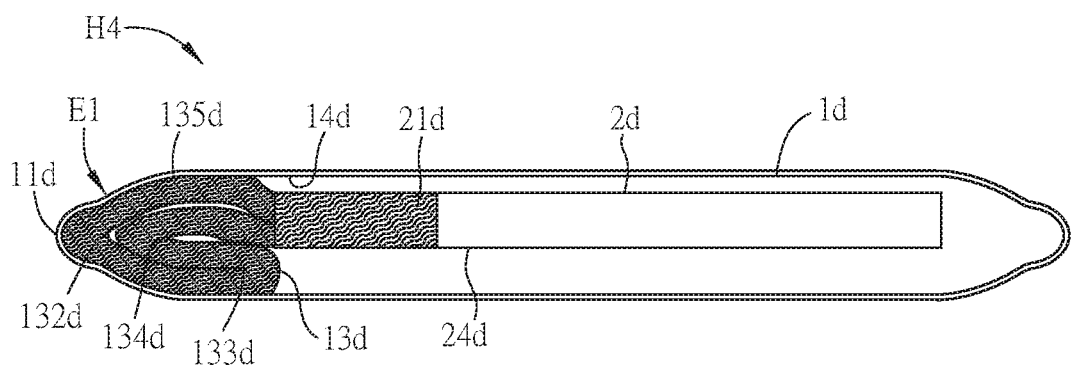

As shown in FIG. 2C, the first capillary structure 21d of the heat pipe H4 is extended to the outside of the second pipe 2d to form the second capillary structure 13d disposed between the inner pipe wall 14d of the first pipe 1d and the outer pipe wall 24d of the second pipe 2d. In other words, in this embodiment, the first capillary structure 21d extended to the outside of the second pipe 2d is also the second capillary structure 13d of the heat pipe H4, and therefore the process can be simplified.

To be noted, the formation methods of the first capillary structures 21b, 21c, 21d and second capillary structures 13b, 13c, 13d in the heat pipes H3, H4, H5 are not meant to be construed in a limiting sense, and they can be made by metal sintering powder, fiber, mesh or their any combination. Besides, the first capillary structures 21b, 21c, 21d and the second capillary structures 13b, 13c, 13d can be made different or the same.

In FIGS. 2B and 2C, the second capillary structure 13c, 13d is disposed in the hollow chamber closer to the evaporator E1 and extended to an outside of the second pipe 2c, 2d. The second capillary structure 13c, 13d is between the end 11c, 11d and the second pipe 2c, 2d. The second capillary structure 13c, 13d occupies at least ⅔ volume of the evaporator E1 and is stuffed with an inside of the evaporator E1.

Like FIG. 1D, the two opposite sides of the outer pipe wall of the second pipe 2c, 2d may directly abut the inner pipe wall of the first pipe 1c, 1d. The inner pipe wall and the outer pipe wall of the first pipe 1c, 1d can be made of the same material.

In FIG. 2B, the first part 211c of the first capillary structure 21c and the second capillary structure 13c are connected to each other by winding so as to enhance transportation therebetween. The second capillary structure 13c is rolled up with multiple turns in the evaporator E1. The second capillary structure 13c is rolled up with respect to a traverse direction D of the heat pipe H3 in the evaporator E1. For example, the second capillary structure 13c may have an uninterrupted section which is rolled up with multiple turns with respect to a traverse direction D of the heat pipe H3 in the evaporator E1. The outermost turn 131c of the second capillary structure 13c discretely contacts the inner pipe wall 14c of the first pipe 1.

In FIG. 2C, the first capillary structure 21d is extended from the second pipe 2d to form a second capillary structure 13d between the inner pipe wall 14d of the first pipe 1d and the second pipe 2d in the evaporator E1. The second capillary structure 13d occupies at least ⅔ volume of the evaporator E1 and is folded up multiple times in the evaporator E1. For example, the second capillary structure 13d may have an uninterrupted section which is folded up multiple times at its folds 132d-134d. An acute angle at the fold is formed by folding up. A total height of the folded second capillary structure 13d can make the outermost surface 135d of the folded second capillary structure 13d firmly contact the inner pipe wall 14d of the first pipe 1d.

Figure 3A:
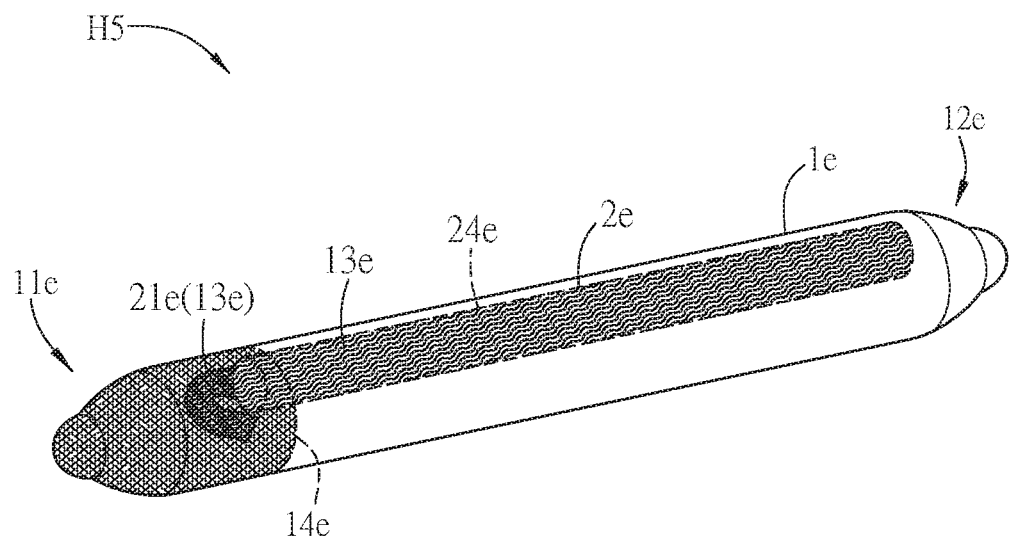
FIG. 3A is a schematic diagram of a part of the appearance of the heat pipe of another embodiment of the disclosure.
Figure 3B:
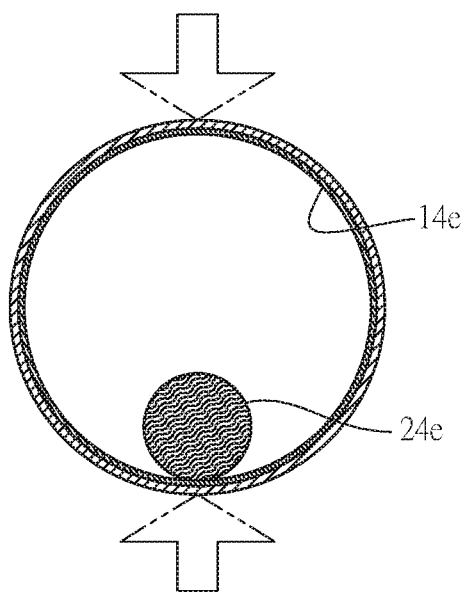
FIG. 3B is a schematic diagram of the heat pipe in FIG. 3A under the flattened process.
Figure 3C:
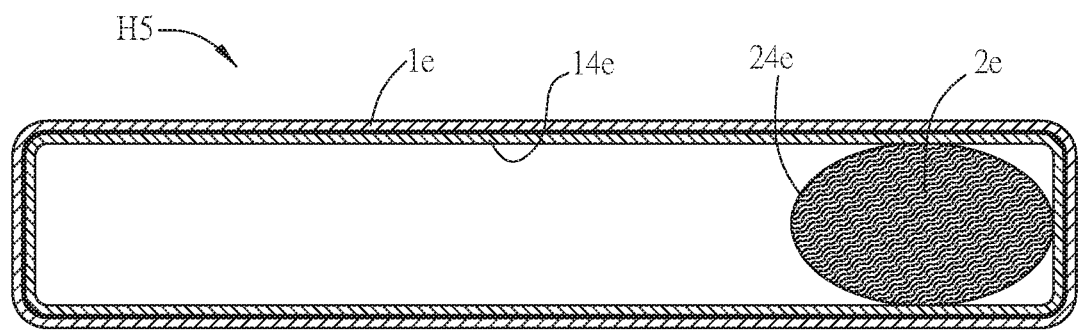
FIG. 3C is a schematic sectional diagram of the heat pipe in FIG. 3A which has been flattened.

FIG. 3A is a schematic diagram of a part of the appearance of the heat pipe of another embodiment of the disclosure, FIG. 3B is a schematic diagram of the heat pipe in FIG. 3A under the flattened process, and FIG. 3C is a schematic sectional diagram of the heat pipe in FIG. 3A which has been flattened. In this embodiment, the structure of the heat pipe H5 is substantially similar to the heat pipe H2 of the above embodiment, but the inner pipe wall 14e of the first pipe 1e at the two ends 11e, 12e contacts the outer pipe wall 24e of the second pipe 2e after the flattened process. When the heat pipe H5 is flattened, the second capillary structure 13e outside the second pipe 2e can entirely or partially cover the first capillary structure 21e extended to the outside of the second pipe 2e, so as to effectively enhance the heat transfer efficiency of the heat pipe H5.

Figure 4A:
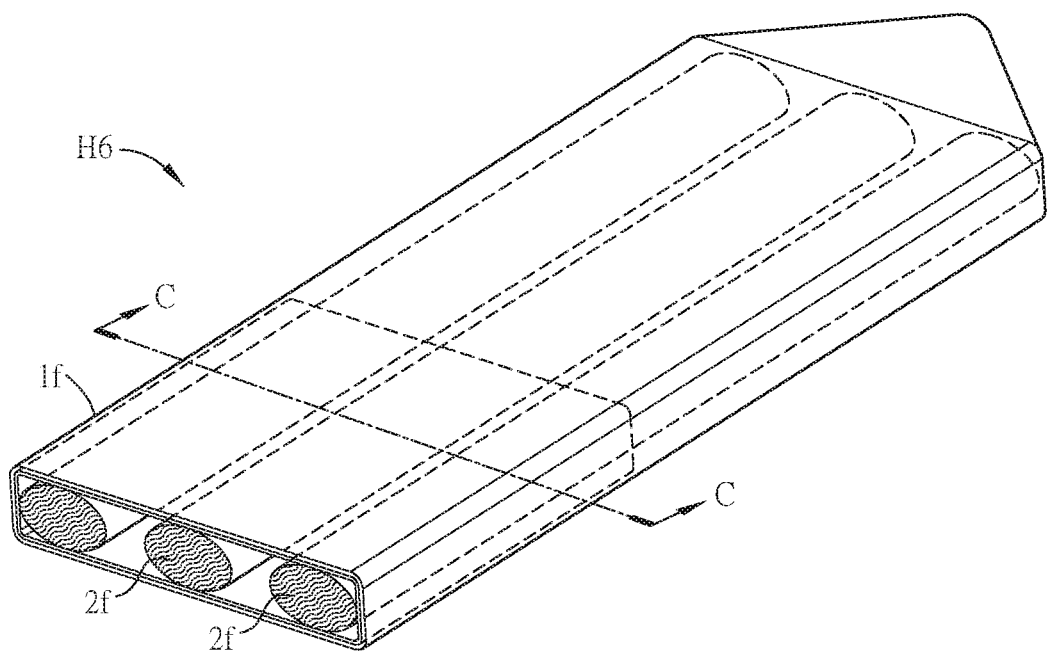
FIG. 4A is a schematic diagram of a part of the appearance of the heat pipe of another embodiment of the disclosure.
Figure 4B:
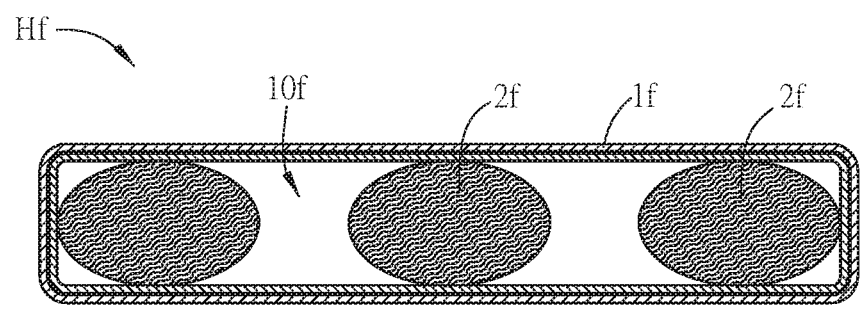
FIG. 4B is a schematic sectional diagram of the heat pipe in FIG. 4A taken along the line C-C.

FIG. 4A is a schematic diagram of a part of the appearance of the heat pipe of another embodiment of the disclosure, and FIG. 4B is a schematic sectional diagram of the heat pipe in FIG. 4A taken along the line C-C. As shown in FIGS. 4A and 4B, in comparison with the above embodiments, the heat pipe H6 includes a larger first pipe 1f. In other words, the first pipe 1f includes a larger hollow chamber 10f. The heat pipe H6 includes a plurality of second pipes 2f which are disposed adjacent to each other in the first pipe 1f. Through the disposition of the plural second pipes 2f, the flat heat pipe H6 can be made with a greater area. Since the heat pipe H6 of this embodiment also undergoes the flattened process, the inner surface of the first pipe 1f presses the outer pipe wall of the second pipe 2f, and therefore the second pipe 2f can serve as the support structure of the heat pipe H6 to prevent the depression and deformation of the heat pipe H6.

Summarily, since the heat pipe of this disclosure includes a first pipe and a second pipe disposed in the first pipe and a first capillary structure is disposed in the portion of the second pipe closer to the evaporator, the vapor can be effectively prevented from flowing back into the second pipe and the working fluid can flow in the second pipe in a single direction. Since this kind of structure is simple for the manufacturing, the quality and yield of the heat pipe can be increased and the cost can be reduced. Furthermore, the heat pipe of this disclosure includes the structure of the inner and outer pipes so that the efficiency of the liquid-vapor circulation in the heat pipe can be enhanced and the heat transfer capability of the heat pipe can be thus enhanced. Therefore, the heat pipe of this disclosure is especially suitable for resisting the temporary heat impact and can effectively meet the requirements of high heat and high heat flux.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A heat pipe, comprising:
   a first pipe including an evaporator, a heat insulator and a condenser which communicate with each other to define a hollow chamber, wherein two ends of the first pipe along an axial direction of the heat pipe are sealed; and
   at least a second pipe disposed in the hollow chamber and including an accommodating space and a first capillary structure disposed in one end of the accommodating space closer to the evaporator;
   wherein at least one side of an outer pipe wall of the second pipe directly abuts an inner pipe wall of the first pipe, the first pipe further includes a second capillary structure which is disposed in the hollow chamber closer to the evaporator and extended to an outside of the second pipe and occupies at least ⅔ volume of the evaporator, a first part of the first capillary structure and the second capillary structure are connected to each other by winding so as to enhance transportation therebetween,
   wherein the second capillary structure has an uninterrupted section which is rolled up with multiple turns around an axis, the axis is extended along a traverse direction to the axial direction of the heat pipe in the evaporator.

2. The heat pipe as recited in claim 1, wherein the second pipe is located in a part of the evaporator, a part of the condenser and the whole heat insulator.

3. The heat pipe as recited in claim 1, wherein the second pipe is just located in a part of the condenser and the whole heat insulator.

4. The heat pipe as recited in claim 1, wherein a section of the first pipe along a radial direction of the first pipe is a uniform section.

5. The heat pipe as recited in claim 1, wherein the second capillary structure contacts a part of the inner pipe wall of the first pipe located at the evaporator and/or a part of the outer pipe wall of the second pipe located at the evaporator.

6. The heat pipe as recited in claim 1, wherein the first capillary structure in the second pipe is extended to the outside of the second pipe, and when the heat pipe is flattened, the second capillary structure outside the second pipe entirely or partially covers the first capillary structure extended to the outside of the second pipe.

7. The heat pipe as recited in claim 1, wherein the first capillary structure closer to the evaporator is filled in the second pipe.

8. The heat pipe as recited in claim 1, further comprising:

a plurality of second pipes disposed adjacent to each other in the first pipe.

9. The heat pipe as recited in claim 1, wherein the hollow chamber of the first pipe is a channel for vapor, the second pipe is a channel for working fluid, the vapor is driven by a vapor pressure difference to move in the first pipe and from the evaporator to the condenser, and the working fluid is driven by the vapor pressure difference to flow in the second pipe and from the condenser to the evaporator.

10. The heat pipe as recited in claim 1, wherein the inner pipe wall and an outer pipe wall of the first pipe are made of a same material.

11. The heat pipe as recited in claim 1, wherein the second capillary structure is stuffed in the evaporator.

* * * * *